United States Patent
Koh et al.

(10) Patent No.: US 7,649,409 B1
(45) Date of Patent: Jan. 19, 2010

(54) ALL-PASS TERMINATION NETWORK WITH EQUALIZATION AND WIDE COMMON-MODE RANGE

(75) Inventors: Yongseon Koh, Palo Alto, CA (US); Babak Matinpour, Sunnyvale, CA (US); Vijaya Ceekala, San Jose, CA (US); Ramsin Ziazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/877,255

(22) Filed: Oct. 23, 2007

(51) Int. Cl.
*H03B 1/00* (2006.01)
(52) U.S. Cl. ......................... 327/559; 326/30
(58) Field of Classification Search ................. 327/559; 326/30
See application file for complete search history.

(56) References Cited

U.S. PATENT DOCUMENTS

| | | | |
|---|---|---|---|
| 6,169,764 B1 * | 1/2001 | Babanezhad | 375/233 |
| 6,320,422 B1 | 11/2001 | Koh et al. | |
| 6,545,622 B1 | 4/2003 | Kamal et al. | |
| 6,597,731 B1 * | 7/2003 | Shuholm | 375/220 |
| 6,856,169 B2 * | 2/2005 | Frans et al. | 326/82 |
| 7,209,007 B1 | 4/2007 | Kamal et al. | |
| 7,224,189 B1 | 5/2007 | Ziazadeh et al. | |
| 7,436,216 B1 * | 10/2008 | Brunn et al. | 326/83 |
| 7,439,760 B2 * | 10/2008 | Nguyen | 326/30 |

OTHER PUBLICATIONS

Andrea Boni, "LVDS I/O Interface for Gb/s-per-Pin Operation in 0.35- m CMOS," IEEE Journal of Solid-State Circuits, vol. 36, No. 4, Apr. 2001, pp. 706-711.
Laszlo Moldovan, "A Rail-to-Rail, Constant Gain, Buffered Op-Amp for Real Time Video Applications," IEEE Journal of Solid-State Circuits, vol. 32, No. 2, Feb. 1997, pp. 169-176.
"Maxim DC-Coupled, UCSP 3.125Gbps Equalizer, MAX3803," 2004, pp. 1-8.
"National Semiconductor Introduces Industry's Lowest Jitter Cable Equalizer for Extending DVI and HDMI Cable Reach Beyond 40 Meters" Mar. 5, 2007, pp. 1-3.
"DS16EV5110 Video Equalizer for DVI, HDMI, and Cat5 Cables," Jun. 2007, pp. 1-18.
Maxim Integrated Products, Inc., "1Gbps to 12.5Gbps Passive Equalizer for Backplanes and Cables," MAX3787, Rev. 2, Feb. 2008, pp. 1-15.

* cited by examiner

*Primary Examiner*—Kenneth B. Wells
(74) *Attorney, Agent, or Firm*—Steven J. Cahill

(57) ABSTRACT

An integrated circuit comprises a pin coupled to receive signals from outside the integrated circuit and an input network. The input network equalizes incoming signals by attenuating lower frequency input signals more than higher frequency input signals received at the pin. The input network is configured to generate a DC bias voltage at an output of the input network in response to an AC coupled input signal or a DC coupled input signal received at the pin with a wide common-mode range.

20 Claims, 5 Drawing Sheets

ALL-PASS TERMINATION NETWORK WITH EQUALIZATION AND WIDE COMMON-MODE RANGE

BACKGROUND OF THE INVENTION

The present invention relates to electronic circuits, and more particularly, to an input network with equalization and a wide common-mode range.

Signals transmitted through a transmission system with termination at the receiving end can be either AC (alternating current) coupled or DC (direct current) coupled. AC coupling is typically used when the common-mode voltage or power supply voltage of the transmitter is different from that of the receiver. DC coupling is typically used when the common-mode voltage or power supply voltage of the transmitter and the receiver are close to one another.

FIG. 1 illustrates a prior art transmission system that is typically used in a DC coupling environment. The transmission system has a transmitter, transmission lines, and a receiver. The transmitter includes NPN bipolar junction transistors 101-102, load resistors 103-104, and current source 105. The transmitter is coupled to receive a supply voltage VCC_TX. The transmitter is configured to receive a differential input signal at inputs IN+ and IN− and to transmit a differential output signal through two transmission lines to the inputs of input buffer 110 in the receiver. The two transmission lines each have a characteristic impedance of $Z_0$.

Input buffer 110 is coupled to receive a second supply voltage VCC_RX. Two termination resistors 111-112 are coupled to the two input terminals of input buffer 110. Resistors 111-112 are also coupled to receive an exposed termination voltage VTERM. VTERM is applied through a pin 115 to resistors 111-112. Without VTERM, the receiver has a limited common-mode voltage range when the difference between supply voltages VCC_TX and VCC_RX is significant. Voltage VTERM is used to extend the common-mode voltage range in the receiver. However, VTERM requires an additional power supply voltage and an additional pin, which are undesirable requirements in many applications.

DETAILED DESCRIPTION OF THE INVENTION

According to some embodiments of the present invention, an integrated circuit comprises a pin coupled to receive signals from outside the integrated circuit and an input network. The input network attenuates lower frequency input signals more than higher frequency input signals received at the pin. The input network is configured to generate a DC (direct current) voltage at an output of the input network in response to an AC (alternating current) coupled input signal received at the pin. The input network is configured to generate a DC voltage at the output of the input network in response to a DC coupled input signal received at the pin.

Various objects, features, and advantages of the present invention will become apparent upon consideration of the following detailed description and the accompanying drawings, in which like reference designations represent like features throughout the figures.

Figure 1:
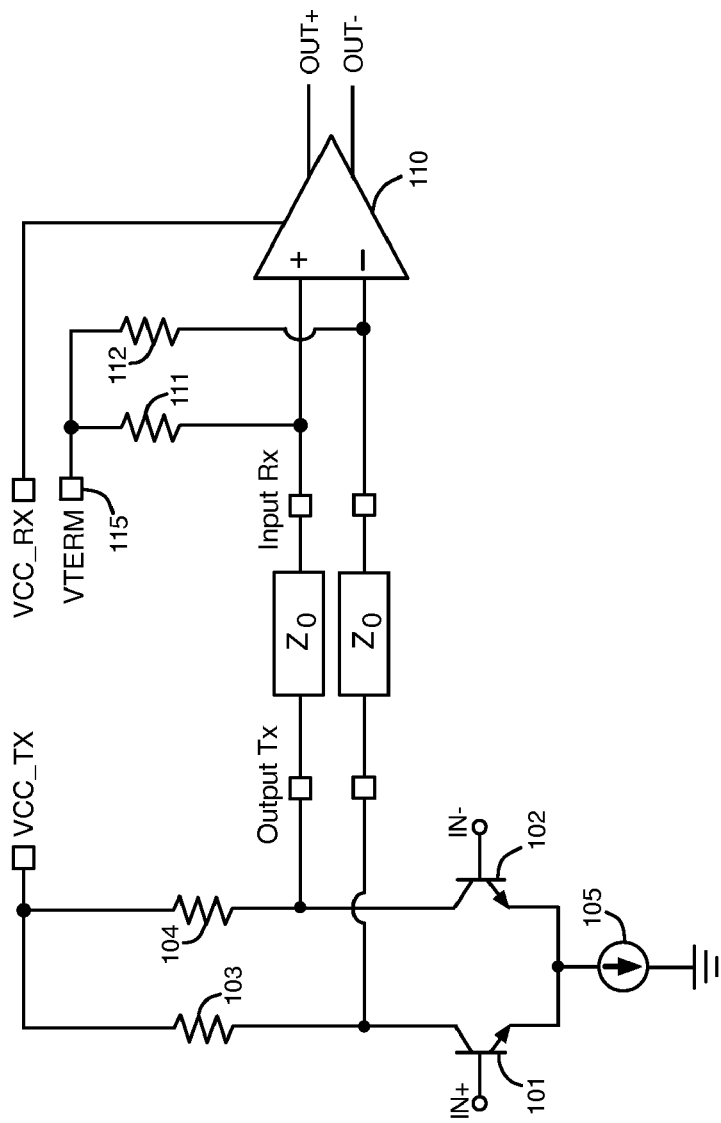
FIG. 1 illustrates a prior art transmission system that is typically used in a DC coupling environment.
Figure 2:
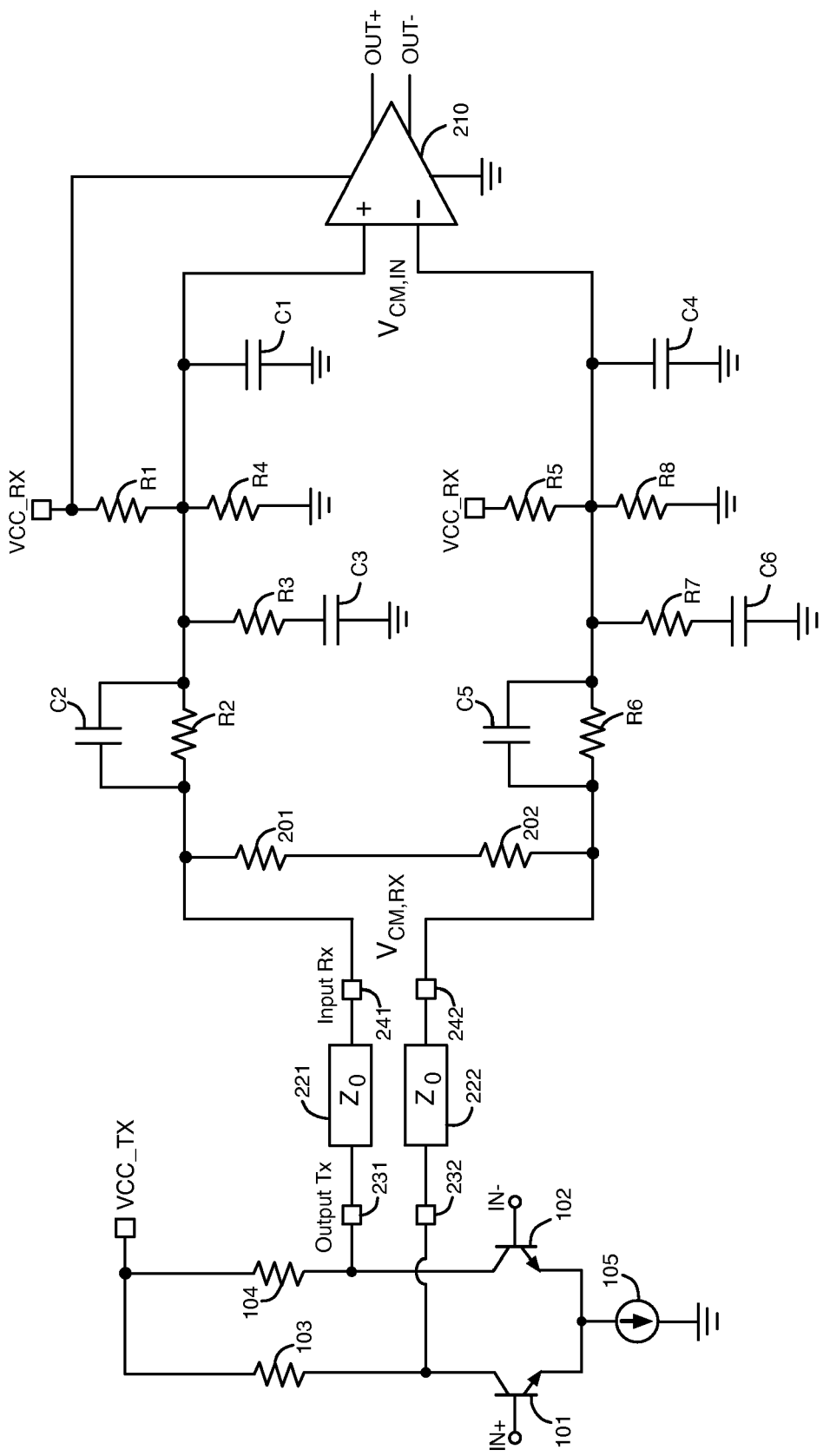
FIG. 2 illustrates an example of an input network that attenuates the lower frequency components of an input signal more than the higher frequency components of the input signal, according to an embodiment of the present invention.

FIG. 2 illustrates an example of an input network that attenuates the lower frequency components of input signals more than the higher frequency components of the input signals, according to an embodiment of the present invention. FIG. 2 illustrates a transmitter circuit and a receiver circuit. The transmitter circuit includes the circuit elements 101-105 described above. The transmitter circuit is configured to transmit a differential output signal through transmission lines 221-222 to a receiver. The receiver includes circuit elements 201-202, 210, R1-R8, and C1-C6 in FIG. 2. Transmission lines 221-222 are coupled between the transmitter output pins 231-232 and the receiver input pins 241-242, respectively.

Receiver circuits 201-202, 210, R1-R8, C1-C6, and pins 241-242 are all fabricated on the same integrated circuit die. Pins 241 and 242 are external terminals of the integrated circuit die that are coupled to receive signals from outside the integrated circuit die through transmission lines 221 and 222, respectively. The transmitter is typically on a different integrated circuit die than the receiver.

Termination resistors 201-202 are coupled in series between differential input pins 241-242, as shown in FIG. 2. The resistance of each of termination resistors 201 and 202 is typically selected to match the characteristic impedance $Z_0$ of each of the transmission lines 221 and 222 to reduce or prevent signal reflection on the transmission lines. The resistance of resistors 201-202 can have any matching impedance value. However, 50 Ohms is a typical value for each of resistors 201-202, because typical transmission lines have a characteristic impedance of 50 Ohms. Resistors 201-202 are weakly connected to the internal bias of the receiver. According to another embodiment, termination resistors 201-202 can be external to the integrated circuit die that contains resistors R1-R8, capacitors C1-C6, and buffer 210. The external resistors are coupled between pins 241-242.

An input network is coupled between pins 241-242 and the inputs of input buffer 210. The input network includes resistors R1-R8 and capacitors C1-C6. Resistor R2 and capacitor C2 are coupled together in parallel between pin 241 and the non-inverting (+) input of input buffer 210. Resistor R1 is coupled between the non-inverting input of input buffer 210 and a high supply voltage VCC_RX of the receiver. Resistor R4 is coupled between the non-inverting input of input buffer 210 and a second supply voltage. The second supply voltage is ground in the example of FIG. 2, although the second supply voltage can be any voltage less than VCC_RX.

Capacitor C1 is coupled between the non-inverting input of input buffer 210 and ground. Resistor R3 and capacitor C3 are coupled together in series between the non-inverting input of input buffer 210 and ground.

Resistor R6 and capacitor C5 are coupled together in parallel between pin 242 and the inverting input (−) of input buffer 210. Resistor R5 is coupled between the inverting input of input buffer 210 and supply voltage VCC_RX. Resistor R8 is coupled between the inverting input of input buffer 210 and the second supply voltage (e.g., ground). Capacitor C4 is coupled between the inverting input of input buffer 210 and ground. Resistor R7 and capacitor C6 are coupled together in series between the inverting input of input buffer 210 and ground.

The receiver of FIG. 2 can be AC coupled by coupling a first capacitor in series between pin 241 and transmission line 221, and a second capacitor is series between pin 242 and transmission line 222. The DC common-mode voltage at pins 241 and 242 is referred to as $V_{CM,RX}$. The DC common-mode voltage at the non-inverting and inverting inputs of input buffer 210 is referred to as $V_{CM,IN}$. When the receiver is AC coupled, $V_{CM,RX}$ and $V_{CM,IN}$ are set by the input network R1-R8 and C1-C6, and $V_{CM,RX}$ and $V_{CM,IN}$ are identical. $V_{CM,RX}$ and $V_{CM,IN}$ can be calculated using equation (1) when the input network R1-R8, C1-C6 of FIG. 2 is AC coupled.

$$V_{CM,RX} = V_{CM,IN} = V_{CC,RX} \times \frac{R_4}{R_4 + R_1} \quad (1)$$

When the input network R1-R8 and C1-C6 of FIG. 2 is DC coupled, $V_{CM,RX}$ is set by the transmitter, and the DC common-mode voltage $V_{CM,IN}$ is determined as a superposition of the DC common-mode voltage $V_{CM,RX}$ and the receiver supply voltage VCC_RX (which is also referred to as $V_{CC,RX}$), as shown below in equation (2).

$$V_{CM,IN} = V_{CM,RX} \times \frac{(R_1 \| R_4)}{R_2 + (R_1 \| R_4)} + V_{CC,RX} \times \frac{(R_2 \| R_4)}{R_1 + (R_2 \| R_4)} \quad (2)$$

In equation (2), $R_1$ is the resistance of resistor R1. $R_2$ is the resistance of resistor R2. $R_4$ is the resistance of resistor R4. $R_1 \| R_4$ refers to the net resistance of resistors R1 and R4 being coupled in parallel with each other, and $R_2 \| R_4$ refers to the net resistance of resistors R2 and R4 being coupled in parallel with each other. Equation (2) is derived using the principle of superposition for electronic circuits. Equations can also be written for $V_{CM,IN}$ by substituting resistors R1, R2, and R4 in equations (1) and (2) for resistors R5, R6, and R8, respectively.

The minimum common-mode input voltage $V_{CM,IN}$ that drives a bipolar common-emitter input buffer 210 with an active current source is $V_{BE}+V_{CE,SAT}$ (e.g., about IV). $V_{BE}$ refers to the base-emitter threshold voltage of a first bipolar junction transistor (BJT), and $V_{CE,SAT}$ refers to the collector-emitter voltage of a second BJT in saturation. The first BJT is one of the BJTs in a differential pair coupled to the input terminals of input buffer 210, and the second BJT is a current source that drives the differential pair. A desired common-mode input voltage $V_{CM,IN}$ can be achieved by choosing an appropriate combination of resistors in the input network, allowing the DC voltage $V_{CM,IN}$ to vary from rail-to-rail (e.g., from VCC_RX to ground).

A trade-off exists between the signal swing and the signal-to-noise ratio of a signal that is transmitted to a receiver. As the signal swing increases, the signal-to-noise ratio of the signal also increases. Another trade-off exists between the signal swing and the slew rate of a signal. The random jitter of a system is inversely proportional to the slew rate of the signal.

A transmission system that has a lossy channel attenuates the signals that are driven through its transmission lines. Therefore, signals having large voltage swings are often chosen to overcome the signal-to-noise ratio degradation and slew rate degradation over long lossy channels and to maintain signal integrity. A transmitter can be designed to drive signals with a large voltage swing to compensate for the loss of signal strength through the transmission lines.

Often, the voltage swing of an input signal is too large for the linear range of the input or signal-conditioning blocks. Signals that are driven with a large voltage swing over transmission lines are attenuated at the receiver end of the transmission system. A resistor divider can be used to attenuate an input signal in a receiver. One drawback of a resistor divider attenuator is that a pole is introduced by the parasitic capacitance of the resistor divider and the input devices, which causes the attenuator to have a limited bandwidth. The limited-bandwidth attenuator further attenuates the high frequency signal components that have already been affected by the channel.

The input network in the receiver of FIG. 2 includes a first resistor divider formed by resistors R1 and R4 and a second resistor divider formed by resistors R5 and R8. Resistors R1 and R4 attenuate the input signal received at input pin 241, and resistors R5 and R8 attenuate the input signal received at input pin 242. Capacitor C1 represents the parasitic capacitance of resistors R1 and R4, and capacitor C4 represents the parasitic capacitance of resistors R5 and R8. By ignoring resistor R3 and capacitors C2 and C3, equation (3) below can be used as the transfer function for $V_{CM,IN}/V_{CM,RX}$ of the resistor divider attenuator at pin 241.

$$\frac{V_{CM,IN}}{V_{CM,RX}} = \frac{\left(R_1 \left\| R_4 \right\| \frac{1}{sC_1}\right)}{R_2 + \left(R_1 \left\| R_4 \right\| \frac{1}{sC_1}\right)} \quad (3)$$

In equation (3), $C_1$ is the capacitance of capacitor C1, $s=\sigma+j\omega$, $\sigma$ refers to the exponential decay constant, $\omega$ refers to the sinusoidal angular frequency, and $j=\sqrt{-1}$. $R_1 \| R_4 \| 1/sC_1$ refers to the net complex impedance of resistor R1 being coupled in parallel with resistor R4 and capacitor C1. Another equation for the transfer function $V_{CM,IN}/V_{CM,RX}$ of the resistor divider attenuator at pin 242 can be written by substituting resistors R1, R2, R4 and capacitor C1 in equation (3) for resistors R5, R6, R8 and capacitor C4, respectively, while ignoring resistor R7 and capacitors C5 and C6.

Equation (3) has a pole that is located at $P_1$, where $P_1$ can be determined using equation (4) below.

$$P_1 = \frac{1}{(R_1 \| R_2 \| R_4) C_1} \quad (4)$$

$P_1$ corresponds to the cutoff frequency for a low pass filter that is formed by resistors R1, R2, R4 and capacitor C1. The low pass filter attenuates frequencies in the input signal at pin 241 that are greater than the cutoff frequency.

Figure 3A:
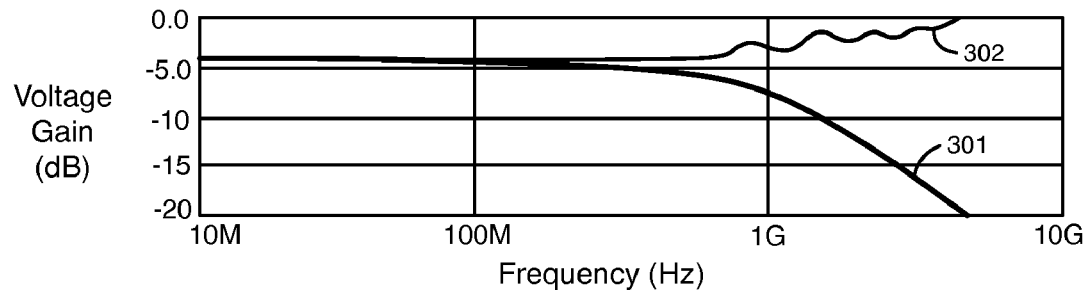
FIG. 3A illustrates the frequency response of the resistor divider attenuator shown in FIG. 2 and the inverse channel response of a short lossy transmission line.

FIG. 3A illustrates the frequency response of the resistor divider attenuator shown in FIG. 2 and the inverse channel response of a short lossy transmission line. The resistor divider attenuator includes resistors R1, R2, R4 and capacitor C1. Curve 301 in FIG. 3A represents the voltage gain in decibels (dB) of the signal contributions from the resistor divider attenuator over a range of frequencies, while ignoring resistor R3 and capacitors C2-C3. Curve 301 is generated using a parasitic capacitance of 50 femtofarads (fF) for capacitor C1. As shown in FIG. 3A, the gain of the resistor divider attenuator decreases at higher frequencies.

Curve 302 in FIG. 3A represents the inverse channel characteristic of a short lossy transmission line (e.g., transmission lines 221-222). As shown in FIG. 3A, the inverse channel frequency response 302 of the short lossy transmission line increases at high frequencies. Thus, the gain of signals transmitted through the short lossy transmission line decreases at high frequencies. The combined effect of the attenuation caused by the short lossy transmission line and the attenuation caused by the resistor divider attenuator (R1, R2, R4, C1) significantly reduces the gain of higher frequency signals at the inputs of input buffer 210.

In order to increase the gain of the higher frequency signals received at input buffer 210, a zero is inserted into the transfer function to cancel the pole $P_1$ by coupling capacitor C2 in parallel with resistor R2 and by coupling capacitor C5 in parallel with resistor R6, as shown in FIG. 2. By ignoring resistor R3 and capacitor C3, equation (5) becomes the attenuator's transfer function $V_{CM,IN}/V_{CM,RX}$.

$$\frac{V_{CM,IN}}{V_{CM,RX}} = \frac{\left(R_1 \left\| R_4 \right\| \frac{1}{sC_1}\right)}{\left(R_2 \left\| \frac{1}{sC_2}\right) + \left(R_1 \left\| R_4 \right\| \frac{1}{sC_1}\right)\right.} \quad (5)$$

The capacitance $C_2$ of capacitor C2 is selected so that the corner frequency that results from the zero in equation (5) is the same as the corner frequency caused by the pole $P_1$ shown in equation (4). By matching pole $P_1$ with the zero caused by capacitor C2 in equation (5), the voltage gain transfer function becomes flat. The resistor divider attenuator formed by resistors R1, R2, R4 and capacitors C1, C2 is an all-pass filter network that has a fixed attenuation over a wide range of frequencies.

Figure 3B:
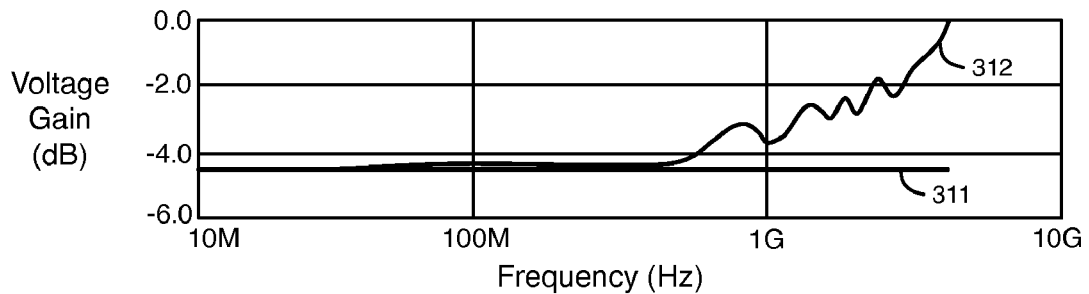
FIG. 3B illustrates the frequency response of the resistor divider attenuator circuit of FIG. 2 having a zero and a pole located at the same corner frequency and the inverse channel response of a short lossy transmission line.

FIG. 3B illustrates the frequency response of the resistor divider attenuator circuit of FIG. 2 having a zero and a pole located at the same corner frequency and the inverse channel response of a short lossy transmission line. Line 311 in FIG. 3B represents the frequency response of the resistor divider attenuator formed by resistors R1, R2, R4 and capacitors C1 and C2 when the zero and the pole of equation (5) are located at the same corner frequency. The voltage gain of this resistor divider attenuator is constant over a wide range of frequencies as shown by line 311 in FIG. 3B. Line 311 represents the AC response of an all-pass attenuator with 50 fF of parasitic capacitance for capacitor C1. Curve 312 in FIG. 3B is the inverse channel characteristic of a short lossy transmission line.

Another equation for the transfer function $V_{CM,IN}/V_{CM,RX}$ can be written by substituting resistors R1, R2, R4 and capacitors C1, C2 in equation (5) for resistors R5, R6, R8 and capacitors C4, C5, respectively, while ignoring resistor R7 and capacitor C6.

Figure 3C:
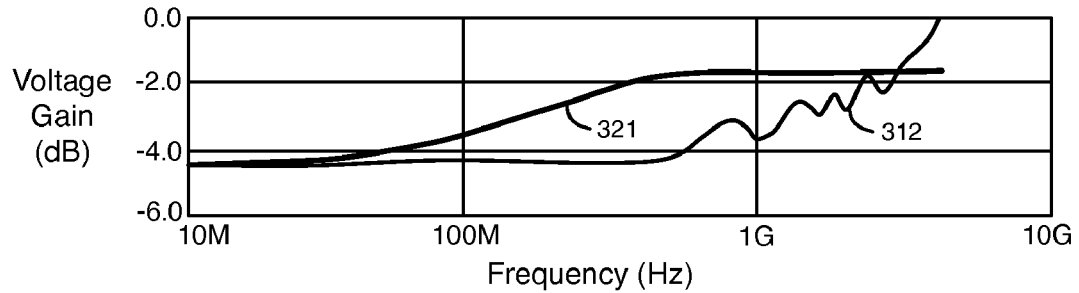
FIG. 3C illustrates the frequency response of the passive equalizer shown in FIG. 2 and the inverse channel characteristic of a short lossy transmission line.

The zero in equation (5) can be shifted to a lower frequency to minimize the loss at higher frequencies by increasing the capacitance $C_2$ of capacitor C2. Shifting the zero in equation (5) to a lower frequency converts the all-pass attenuator frequency response 311 shown in FIG. 3B into a passive equalizer, as shown in FIG. 3C. In this context, a passive equalizer refers to a circuit that attenuates lower frequency input signals more than higher frequency input signals.

FIG. 3C illustrates the frequency response of the passive equalizer shown in FIG. 2 and the inverse channel characteristic of a short lossy transmission line. Curve 321 represents the frequency response of the passive equalizer formed by resistors R1, R2, R4 and capacitors C1 and C2 when the zero in equation (5) occurs at a lower frequency than the pole $P_1$. Because the zero occurs at a lower frequency than the pole, the passive equalizer provides a greater voltage gain for higher frequency input signals, relative to the lower frequency input signals, in an attempt to compensate for the attenuation of the short lossy transmission line, which is shown by curve 312.

The drawback of the passive equalizer having frequency response 321 in FIG. 3C is that the transfer function does not match the inverse characteristic of the lossy transmission line. Instead, the passive equalizer having frequency response 321 increases the gain of some frequencies too much. Thus, when the capacitance $C_2$ of capacitor C2 is increased to minimize the loss at higher frequencies, the zero is shifted to a lower frequency than desired.

According to an embodiment of the present invention, resistors R3, R7 and capacitors C3, C6 are added to the input network of FIG. 2 to introduce a second pole and a second zero into the transfer function of the input network. The second pole and the second zero cause the transfer function of the input network to more closely match the inverse channel characteristic of a lossy transmission line. The transfer function of the input network in FIG. 2 with resistor R3 and capacitor C3 is shown below in equation (6).

$$\frac{V_{CM,IN}}{V_{CM,RX}} = \frac{\left(R_1 \left\| R_4 \right\| \frac{1}{sC_1} \left\| \left(R_3 + \frac{1}{sC_3}\right)\right.\right)}{\left(R_2 + \frac{1}{sC_2}\right) + \left(R_1 \left\| R_4 \right\| \frac{1}{sC_1} \left\| \left(R_3 + \frac{1}{sC_3}\right)\right.\right)} \quad (6)$$

In equation (3) $V_{CM,IN}$ is the output voltage of the input network of FIG. 2, and $V_{CM,RX}$ is the input voltage of the input network of FIG. 2. $R_3$ is the resistance of resistor R3, $C_3$ is the capacitance of capacitor C3, and ∥ refers to the net impedance of circuit elements coupled together in parallel.

Figure 3D:
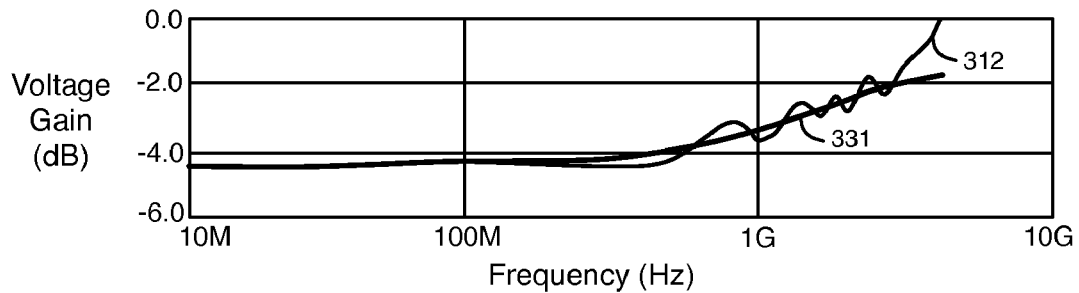
FIG. 3D illustrates an example of the frequency response of the complete input network shown in FIG. 2 and the inverse channel response of a short lossy transmission line.

Typically, the two poles and two zeros in the transfer function of equation (6) are spaced very closely together so that they interact with each other. FIG. 3D illustrates an example of the frequency response of the complete input network shown in FIG. 2. Curve 331 in FIG. 3D represents the frequency response of the complete input network with circuit elements R1-R8 and C1-C6 shown in FIG. 2. As shown in FIG. 3D, the frequency response curve 331 closely matches the average value of the inverse channel characteristic 312 of a lossy transmission line (e.g., an FR4 board trace) over a wide range of frequencies.

After each zero, the slope of the frequency response increases by 20 decibels (dB) per decade. After each pole, the slope of the frequency response decreases by 20 dB per decade. The extra zero introduced by R3/C3 can, for example, be located near the frequency at which the transmission channel begins to attenuate higher frequency signals. The extra pole introduced by R3/C3 can, for example, be located near the upper end of the desired frequency range or when the frequency response of the transmission channel begins to flatten out again. The zero introduced by capacitor C2 can be located at a frequency that cancels out the pole introduced by the resistor divider attenuator, as described above with respect to FIG. 3B.

The transfer function shown in equation (6) is valid for the input network of FIG. 2 whether it is AC coupled or DC coupled. Another equation for the transfer function $V_{CM,IN}/V_{CM,RX}$ can be written by substituting resistors R1, R2, R3, R4 and capacitors C1, C2, C3 in equation (6) for resistors R5, R6, R7, R8 and capacitors C4, C5, C6, respectively. The resistances of resistors R5, R6, R7, and R8 are preferably the same as the resistances of the corresponding resistors R1, R2, R3, and R4, respectively. Also, the capacitances of capacitors C4, C5, and C6 are preferably the same as the capacitances of the corresponding capacitors C1, C2, and C3, respectively.

According to various embodiments of the present invention, any of the resistors 201-202 and R1-R8 shown in FIG. 2 can be active resistors or passive resistors. Active resistors can be, for example, field-effect transistors that function as resistors. The transistors are set by bias voltages to operate in their linear regions and to maintain a stable drain-source on resistance. Passive resistors can be, for example, polysilicon resistors.

According to other embodiments, any of the resistors 201-202 and R1-R8 shown in FIG. 2 can include a network of resistors or a network of transistors. For example, resistor R3 can include a set of transistors. A select number of the transistors are coupled together in parallel when one or more pass gates or switches are turned on. The resistance of R3 is determined by the net on resistance of the transistors that are coupled together in parallel by the pass gates.

Any of the capacitors C1-C6 can be, for example, field-effect transistors. One terminal of the capacitor is coupled to the gate of the transistor, and the other terminal of the capacitor is coupled to the drain and the source of the transistor.

The input network of FIG. 2 can be used for an AC coupling interface or for a DC coupling interface. The input network of FIG. 2 is configured to generate a DC voltage at the inputs of input buffer 210 in response to an AC coupled input signal received at pins 241-242. The input network of FIG. 2 is also configured to generate a DC voltage at the inputs of input buffer 210 in response to a DC coupled input signal received at pins 241-242.

The input network of FIG. 2 can provide a rail-to-rail (i.e., high supply voltage to low supply voltage) common-mode voltage range for $V_{CM,IN}$ from the supply voltage VCC_RX to ground without any additional bias networks, pins, or power supply voltages. Resistor R2 can be selected to have a relatively large resistance to help ensure the rail-to-rail common-mode voltage range for $V_{CM,IN}$.

In addition, the input network of FIG. 2 that includes R1-R8 and C1-C6 is a built-in passive equalizer that selectively attenuates the lower frequency components of the input signals, while minimizing the loss of the higher frequency components of the input signals. The transfer function of the passive equalization, shown in equation (6), has an additional pole and an additional zero. The additional pole and the additional zero can be optimized to match the inverse channel frequency response of a lossy transmission line for maximum signal integrity, as shown in FIG. 3D.

Figure 4:
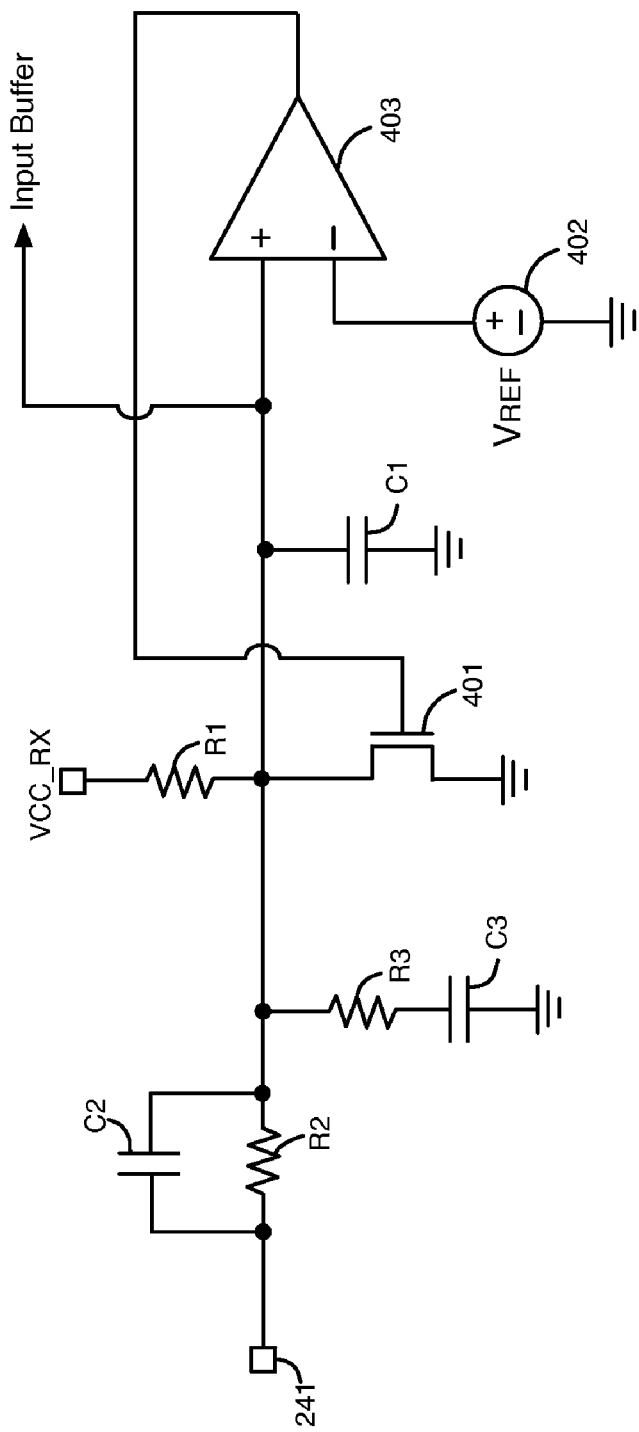
FIG. 4 illustrates an input network having a transistor that is controlled by an amplifier, according to another embodiment of the present invention.

FIG. 4 illustrates an input network having a transistor that is controlled by an amplifier, according to another embodiment of the present invention. The input network of FIG. 4 includes resistors R1-R3 as well as capacitors C1-C3. The input network of FIG. 4 also includes an n-channel metal oxide semiconductor field-effect transistor (MOSFET) 401, a voltage source 402, and an amplifier 403.

The non-inverting input of amplifier 403 is coupled to the non-inverting input of input buffer 210 and to the drain of transistor 401. The inverting input of amplifier 403 is coupled to voltage source 402. Voltage source 402 generates a reference voltage $V_{REF}$ at the inverting input of amplifier 403. The output terminal of amplifier 403 is coupled to the gate of transistor 401.

Amplifier 403 drives the gate voltage of transistor 401. The gain of amplifier 403 is high enough to cause the input voltage at its non-inverting input terminal to be approximately equal to $V_{REF}$ (e.g., 1 volt). As a result, amplifier 403 maintains the drain-source voltage ($V_{DS}$) across transistor 401 at a constant voltage. The drain-source on resistance of transistor 401 varies inversely with the drain current through transistor 401. Resistor R8 can be replaced by a second transistor that is controlled by a second amplifier. The circuit elements in FIG. 4 can also provide a rail-to-rail common-mode voltage range and a frequency response that matches the average inverse channel frequency response of a short lossy transmission line.

Figure 5:
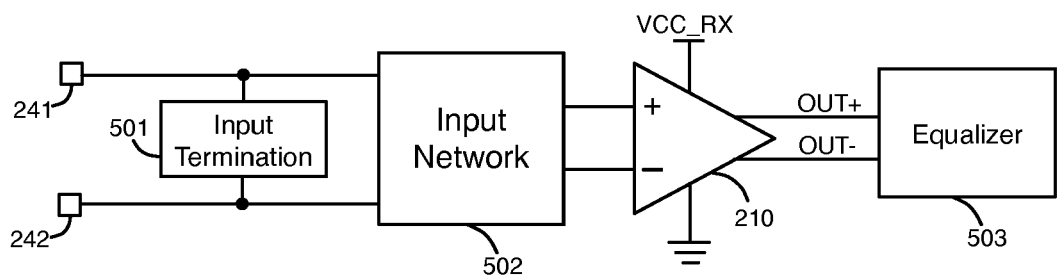
FIG. 5 illustrates an example of an equalizer application for an input network of the present invention.

FIG. 5 illustrates an example of an equalizer application for an input network of the present invention. Input termination circuit 501 is coupled to terminate input signals at input pins 241-242. Input termination circuit 501 includes termination resistors 201-202, described above. Although input termination circuit 501 can include any suitable number of termination resistors.

Input network 502 includes resistors R1-R8 and capacitors C1-C6 that are described above with respect to FIG. 2 or the circuitry shown in FIG. 4. Input network 502 is coupled to input pins 241-242, input termination network 501, and the inputs of input buffer 210. The differential output terminals (OUT+ and OUT−) of input buffer 210 drive an equalizer circuit 503. Equalizer circuit 503 can perform any desired equalization function, such as selectively increasing the gain of higher frequency input signals more than lower frequency input signals. Thus, input network 502 and equalizer 503 both provide more gain to higher frequency input signals than to lower frequency input signals.

Figure 6:
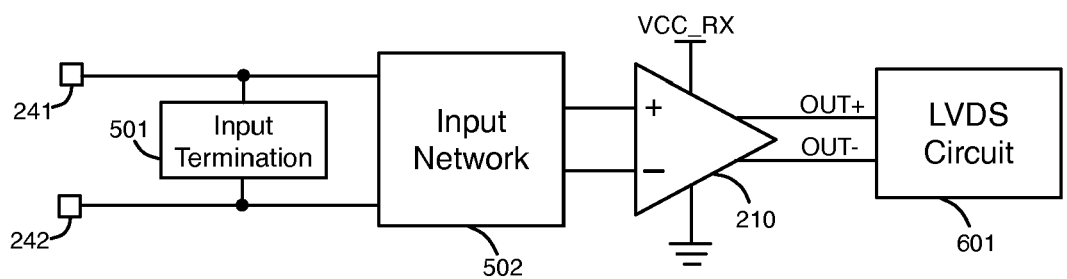
FIG. 6 illustrates an example of an LVDS application for an input network of the present invention.

FIG. 6 illustrates an example of an LVDS application for an input network of the present invention. Input network 502 includes resistors R1-R8 and capacitors C1-C6 shown in FIG. 2 or the circuitry shown in FIG. 4. The differential output terminals (OUT+ and OUT−) of input buffer 210 drive a low voltage differential signaling (LVDS) circuit 601. LVDS circuit 601 can perform any number of functions related to low voltage differential signaling. For example, LVDS circuit 601 can be an amplifier circuit that is part of a receiver.

Some LVDS applications use a complementary LVDS differential amplifier to achieve a wider input common-mode voltage range. A complementary LVDS differential amplifier has a p-channel MOSFET differential pair and an n-channel MOSFET differential pair. The inputs of both differential pairs are coupled receive the differential input signal of the amplifier. Input network 502 provides a rail-to-rail common-mode range from VCC_RX to ground for the common-mode input voltage as described above. Therefore, input network 502 eliminates the need to use a complementary LVDS differential amplifier in an LVDS receiver.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, variations, and substitutions are possible in light of the above teachings, without departing from the scope of the present invention.

What is claimed is:

1. An integrated circuit comprising:
   a first pin that receives signals from outside the integrated circuit; and
   a first input network comprising a first resistor and a first capacitor coupled together in series to generate a first pole and a first zero in a transfer function of the first input network, wherein the first input network attenuates lower frequency input signals more than higher frequency input signals received at the first pin,
   wherein the first input network is configured to generate a DC voltage at an output of the first input network in response to an AC coupled input signal received at the first pin, and the first input network is configured to generate a DC voltage at the output in response to a DC coupled input signal received at the first pin.

2. The integrated circuit defined in claim 1 wherein the first input network generates a DC voltage at the output in response to a DC coupled input signal as a superposition of a supply voltage and a DC input voltage at the first pin.

3. The integrated circuit defined in claim 1 wherein the first input network is configured to receive first and second supply voltages, and the output of the first input network has a rail-to-rail common-mode voltage range from the first supply voltage to the second supply voltage.

4. The integrated circuit defined in claim 1 wherein the transfer function of the first input network has at least two poles and at least two zeros.

5. The integrated circuit defined in claim 1 wherein the first input network further comprises:
   a resistor divider that generates a second pole in the transfer function of the first input network; and
   a second capacitor coupled to the resistor divider that generates a second zero in the transfer function.

6. The integrated circuit defined in claim 1 further comprising:
   a termination circuit coupled to the first pin; and
   an input buffer coupled to the output of the first input network.

7. The integrated circuit defined in claim 6 further comprising:
   a second pin coupled to the termination circuit and coupled to receive signals from outside the integrated circuit; and
   a second input network coupled to the input buffer, wherein the second input network comprises a second resistor and a second capacitor coupled together in series to generate a pole and a zero in a transfer function of the second input network, and wherein the second input network attenuates lower frequency input signals received at the second pin more than higher frequency input signals received at the second pin,
   wherein the first and the second input networks generate a DC common-mode voltage in response to AC coupled input signals, and the second input network generates a DC voltage at an output of the second input network in response to a DC coupled input signal received at the second pin.

8. The integrated circuit defined in claim 1 further comprising:
   an input buffer coupled to the output of the first input network; and
   an equalizer coupled to receive an output signal of the input buffer.

9. The integrated circuit defined in claim 1 further comprising:
   an input buffer coupled to the output of the first input network; and
   an LVDS circuit coupled to receive an output signal of the input buffer.

10. An integrated circuit comprising:
    a first pin coupled to receive signals from outside the integrated circuit;
    a first input network comprising a first resistive circuit and a first capacitive circuit coupled together in series to generate a first pole and a first zero in a transfer function of the first input network, wherein the first input network selectively attenuates lower frequency signals more than higher frequency signals received at the first pin to at least partly compensate for loss on a first transmission line coupled to the first pin; and
    an input buffer having a first input coupled to the first input network, wherein the first input network is configured to generate a DC voltage at the first input of the input buffer in response to an AC coupled input signal received at the first pin, and the first input network is configured to generate a DC voltage at the first input of the input buffer in response to a DC coupled input signal received at the first pin.

11. The integrated circuit defined in claim 10 wherein the first input network is configured to receive first and second supply voltages, and an output of the first input network has a rail-to-rail common-mode voltage range from the first supply voltage to the second supply voltage.

12. The integrated circuit defined in claim 10 wherein the first input network generates a DC common-mode voltage at the first input of the input buffer in response to a DC coupled input signal as a superposition of a supply voltage and a DC common-mode input voltage received at the first pin.

13. The integrated circuit defined in claim 10 wherein the first input network further comprises:
    a resistor divider that generates a second pole in the transfer function of the first input network, wherein the transfer function equals an output voltage of the first input network divided by an input voltage of the first input network;
    a second resistive circuit coupled to the resistor divider; and
    a second capacitive circuit coupled in parallel with the second resistive circuit that generates a second zero in the transfer function.

14. The integrated circuit defined in claim 10 further comprising:
    a termination circuit coupled to the first pin.

15. The integrated circuit defined in claim 10 further comprising:
    a second pin coupled to receive signals from outside the integrated circuit; and
    a second input network coupled to a second input of the input buffer that attenuates lower frequency signals received at the second pin more than higher frequency signals received at the second pin to at least partly compensate for loss on a second transmission line coupled to the second pin.

16. The integrated circuit defined in claim 10 wherein the first input network comprises:
    a transistor coupled to a first input of the input buffer; and
    an amplifier having a first input coupled to a drain of the transistor, a second input coupled to receive a reference voltage, and an output that controls a voltage at a gate of the transistor.

17. The integrated circuit defined in claim 10 wherein the transfer function of the first input network has at least two poles and at least two zeros.

18. The integrated circuit defined in claim 10 wherein the first input network selectively attenuates the lower frequency signals more than the higher frequency signals to match an average inverse channel frequency response of the first transmission line.

19. A method for filtering an input signal received in an integrated circuit, the method comprising:

receiving an input signal at a pin from a transmission line; and attenuating lower frequency components of the input signal more than higher frequency components of the input signal to at least partly compensate for loss on the transmission line using an input network, wherein the input network is configured to generate a DC voltage at an output of the input network in response to an AC coupled input signal received at the pin and in response to a DC coupled input signal received at the pin, and wherein the input network comprises a first resistor and a capacitor coupled together in series that generate a pole and a zero in a transfer function of the input network.

20. The method defined in claim 19 further comprising:

terminating the input signal using a termination resistor coupled to the pin; and buffering the input signal using an input buffer coupled to the output of the input network, wherein the transfer function of the input network has at least two poles and at least two zeros.

* * * * *